United States Patent
Kajihara et al.

(10) Patent No.: US 6,617,504 B2
(45) Date of Patent: Sep. 9, 2003

(54) THERMOELECTRIC ELEMENT, METHOD OF FABRICATING THE SAME, AND THERMOELECTRIC MODULE EMPLOYING THE SAME

(75) Inventors: Takeshi Kajihara, Hiratsuka (JP); Akio Konishi, Hiratsuka (JP); Yong Hoon Lee, Hiratsuka (JP); Kiyoharu Sasaki, Hiratsuka (JP); Kenichi Tomita, Hiratsuka (JP); Takeji Kajiura, Isehara (JP)

(73) Assignee: Komatsu Ltd., Tokyo (JP)

( * ) Notice: Subject to any disclaimer, the term of this patent is extended or adjusted under 35 U.S.C. 154(b) by 0 days.

(21) Appl. No.: 09/851,124
(22) Filed: May 9, 2001
(65) Prior Publication Data
US 2001/0052357 A1 Dec. 20, 2001

(30) Foreign Application Priority Data
May 9, 2000 (JP) ........................................ 2000-135618

(51) Int. Cl.⁷ ............................ H01L 35/00; B22F 9/06; B22F 1/00
(52) U.S. Cl. ............................ 136/201; 75/334; 419/41; 419/48
(58) Field of Search ................................ 136/201, 203, 136/205; 75/333, 334; 419/48, 41

(56) References Cited

U.S. PATENT DOCUMENTS 2,304,130 A * 4/1941 Truthe ............................ 83/91
6,043,424 A * 3/2000 Horio et al. .............. 136/236.1
6,313,392 B1 * 11/2001 Sato et al. .................. 136/201

FOREIGN PATENT DOCUMENTS

| EP | 0369340 | * 5/1990 |
| EP | 0476134 | * 3/1992 |
| JP | 63138789 | 6/1988 |
| JP | 2107727 | 4/1990 |
| JP | 04-293276 | * 10/1992 |
| JP | 4293276 | 10/1992 |
| JP | 10-056210 | * 2/1998 |
| JP | 10-178219 | * 6/1998 |

* cited by examiner

*Primary Examiner*—Patrick Ryan
*Assistant Examiner*—Thomas H. Parsons
(74) *Attorney, Agent, or Firm*—Varndell & Varndell, PLLC (57) ABSTRACT

A method of fabricating a thermoelectric element of enhanced thermoelectric performance is provided by improving the preparation of thermoelectric material and employing hot plastic working in combination. The method comprises the step (a) of mixing and heat-melting a raw material of a predetermined composition; the step (b) of turning the heat-melted material 106 into microglobules by either of scattering and spraying, and then quenching the microglobules, thereby providing a globular powdery thermoelectric material; and the step (c) of plastically deforming the thermoelectric material in a hot condition, thereby to bring crystal grains of the thermoelectric material into a crystal orientation affording an excellent figure of merit.

23 Claims, 7 Drawing Sheets

Z EXTRUDING DIRECTION

THERMOELECTRIC ELEMENT, METHOD OF FABRICATING THE SAME, AND THERMOELECTRIC MODULE EMPLOYING THE SAME

BACKGROUND OF THE INVENTION

1. Field of the Invention

The present invention relates to a thermoelectric element which performs the conversion between thermal energy and electric energy, and a method of fabricating the thermoelectric element. Further, the present invention relates to a thermoelectric module which is fabricated by employing such thermoelectric elements.

2. Description of the Related Art

A "thermoelectric phenomenon" is the general term of the Seebeck effect, the Peltier effect and the Thomson effect, and elements utilizing the phenomenon are called a "thermoelectric element", a "thermocouple", an "electronic cooling element", etc. The thermoelectric phenomenon was originally discovered between different kinds of metals, but in recent years, thermoelectric materials of semiconductors have come to be obtained, and conversion efficiencies not observed with metal materials have come to be attained. Elements employing the thermoelectric semiconductor materials are structurally simple, are easy of handling and can maintain stable characteristics, so that their uses in a wide range attract public attention. In particular, since the elements are capable of precise temperature controls at and near the room temperature, researches and developments have been extensively promoted for temperature regulations in optoelectronics, semiconductor lasers, etc., and for applications to local cooling, small-sized refrigerators, etc.

The figure of merit Z indicating the performance of the thermoelectric material is expressed in terms of the specific resistance (resistivity) $\rho$, thermal conductivity $\kappa$ and Seebeck coefficient $\alpha$ of the material, as follows:

$$Z=\alpha^2/\rho\kappa$$

Incidentally, the Seebeck coefficient $\alpha$ assumes a positive value in a P-type semiconductor material, whereas it assumes a negative value in an N-type semiconductor material. The thermoelectric element should desirably be large in the figure of merit Z.

Meanwhile, in each of the official gazettes of Japanese Patent Applications Laid-open No. 138789/1988, No. 186299/1996 and No. 56210/1998, it is disclosed to enlarge the figure of merit Z in such a way that extrusion molding working which is a kind of plastic deformation working is employed as a method of molding a thermoelectric element (thermoelectric material, thermoelectric transducer, or sintered thermoelectric semiconductor element).

Also, a globular powdery thermoelectric material for use in the fabrication of a thermoelectric element is disclosed in the official gazette of Japanese Patent Application Laid-open No. 293276/1992. Heretofore, a powdery thermoelectric material has been prepared in such a way that an ingot, which is obtained by heat-melting a predetermined raw material and then cooling the resulting melt, is pulverized, and that the resulting powder is classified. With this method, however, a time period expended on the pulverization as well as the classification is long, and the powder is liable to be contaminated. Further, lowering in the available percentage of the thermoelectric material occurs due to the loading of a sieve at the step of the classification. Besides, especially in case of employing a cleavable material, powdery grains after the pulverization are in the shape of scales. Therefore, the flow of the powder worsens to lower a filling rate in the case where a die is filled up with the powder in order to mold it into the thermoelectric material. Simultaneously, since the surface area of each powdery grain is large relative to the volume thereof, the surface of the powder is liable to oxidize. These problems are alleviated by employing the globular powdery material, but the alleviation is not satisfactory yet.

SUMMARY OF THE INVENTION

In view of the above, the present invention has for its object to improve a method of manufacturing a globular powdery thermoelectric material and to combine the method with hot extrusion molding or hot upset forging, thereby to provide a method of fabricating a thermoelectric element as enhances the figure of merit, attains homogeneity in plastic deformation and heightens an available percentage, and the thermoelectric element which is fabricated by the fabricating method. A further object of the present invention is to provide a thermoelectric module which is fabricated including such thermoelectric elements.

In order to accomplish the first-mentioned object, a method of fabricating a thermoelectric element as based on the first viewpoint of the present invention, comprises the step of mixing and heat-melting a raw material of predetermined composition; the step of turning the heat-melted material into microglobules by either of scattering and spraying, and then quenching the microglobules, thereby to prepare a globular powdery thermoelectric material; and the step of plastically deforming the thermoelectric material in a hot condition, thereby to bring crystal grains of said thermoelectric material into a crystal orientation affording an excellent figure of merit.

Besides, a method of fabricating a thermoelectric element as based on the second viewpoint of the present invention, comprises the step of mixing and heat-melting a raw material of predetermined composition; the step of turning the heat-melted material into microglobules by either of scattering and spraying, and then quenching the microglobules, thereby to prepare a globular powdery thermoelectric material; the step of uniformizing grain diameters of the globular powdery thermoelectric material; the step of sintering under pressure the globular powdery thermoelectric material of the uniform grain diameters; and the step of plastically deforming the thermoelectric material sintered under pressure, in a hot condition, thereby to bring crystal grains of said thermoelectric material into a crystal orientation affording an excellent figure of merit.

Further, a method of fabricating a thermoelectric element as based on the third viewpoint of the present invention, comprises the step of mixing and heat-melting a raw material of predetermined composition; the step of turning the heat-melted material into microglobules by either of scattering and spraying, and then quenching the microglobules, thereby to prepare a globular powdery thermoelectric material; the step of uniformizing grain diameters of the globular powdery thermoelectric material; the step of cold-compressing the resulting globular powdery thermoelectric material in an atmosphere of either of an inert gas and a reducing gas; and the step of plastically deforming the cold-compressed thermoelectric material in a hot condition, thereby to bring crystal grains of said thermoelectric material into a crystal orientation affording an excellent figure of merit.

In addition, a thermoelectric element according to the present invention is fabricated by employing the above fabricating method. The thermoelectric element may be made from a raw material being a semiconductor of either of P-type and N-type as contains at least two elements selected from the group consisting of Bi, Te, Sb and Se.

Yet in addition, a thermoelectric module according to the present invention comprises a plurality of such P-type thermoelectric elements; a plurality of such N-type thermoelectric elements; first and second substrates which serve to hold the plurality of P-type and N-type thermoelectric elements; a plurality of first electrodes which are formed on the first substrate, and each of which connects the adjacent P-type and N-type thermoelectric elements; and a plurality of second electrodes which are formed on the second substrate, and each of which connects the adjacent P-type and N-type thermoelectric elements.

According to the present invention, a heat-melted material is turned into microglobules by scattering or spraying, and the microglobules are quenched, thereby to prepare a globular powdery thermoelectric material, so that the globular powdery thermoelectric material of high globularity, small grain diameters and small crystal grains can be obtained. Further, hot plastic working is carried out, so that homogeneity in plastic deformation can be attained to heighten a crystal orientation. It is accordingly possible to improve the figure of merit of a thermoelectric element or a thermoelectric module, and to enhance the available percentage of products.

PREFERRED EMBODIMENTS OF THE INVENTION

Now, embodiments of the present invention will be described with reference to the drawings. By the way, identical reference numerals shall be assigned to the same constituents, which shall be omitted from description.

Figure 1:
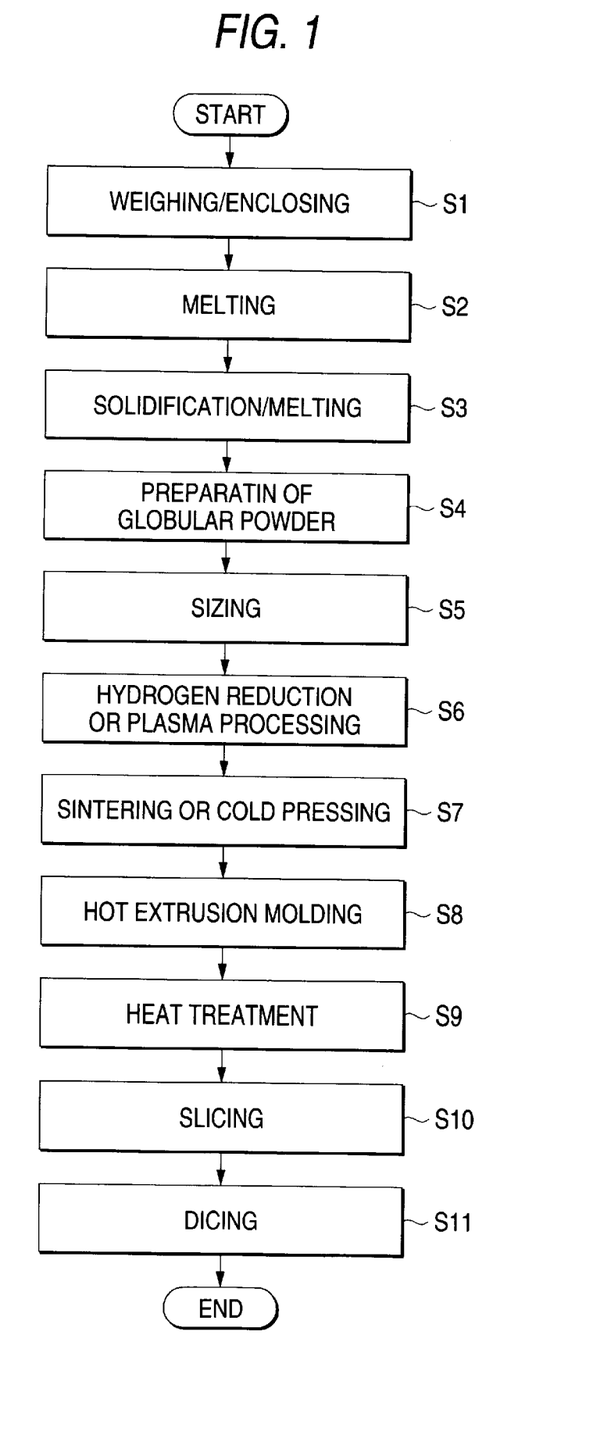
FIG. 1 is a flow chart showing a method of fabricating a thermoelectric element according to the first embodiment of the present invention.

FIG. 1 is a flow chart showing a method of fabricating a thermoelectric element according to the first embodiment of the present invention.

First, at a step S1, a raw material having a predetermined composition is weighed and is enclosed in a vessel. The raw material of a thermoelectric material contains, for example, antimony (Sb) or bismuth (Bi) being a group-V element, or selenium (Se) or tellurium (Te) being a group-VI element. Since the solid solution of the group-V and group-VI has a hexagonal structure, at least two elements among Bi, Te, Sb and Se are used for the raw material. Regarding the practicable composition of the thermoelectric material, the solid solution of a mixed crystal system consisting of bismuth telluride ($Bi_2Te_3$) and antimony telluride ($Sb_2Te_3$) and doped with a dopant of P-type can be used as the material of a P-type element, while the solid solution of a mixed crystal system consisting of bismuth telluride ($Bi_2Te_3$) and bismuth selenide ($Bi_2Se_3$) and doped with a dopant of N-type can be used as the material of an N-type element.

Subsequently, the raw material is heat-melted at a step S2.

Next, at a step S3, the heat-melted material is once solidified so as to form a solid solution ingot. Incidentally, the step S3 may be omitted.

At the next step S4, a globular powdery thermoelectric material is prepared from the heat-melted material. The details of this step will be explained later.

Further, the globular powdery thermoelectric material is sized at a step S5. By way of example, the powder is passed through a sieve so as to uniformize grain diameters to at most 200 μm, desirably at most 150 μm.

Still further, at a step S6, a surface treatment based on hydrogen reduction or plasma processing is carried out in order to eliminate an oxide film formed on the surface of the globular powdery thermoelectric material. Incidentally, the step S6 can also be omitted.

Besides, the globular powdery thermoelectric material is sintered under pressure at a step S7. By way of example, hot pressing or plasma processing is performed in the atmosphere of an inert gas such as argon (Ar) or a reducing gas such as hydrogen ($H_2$). Herein, a sintering temperature should desirably lie within a range of 350° C.–550° C. Alternatively, cold compressing may well be performed in the inert gas atmosphere or reducing gas atmosphere.

Subsequently, a step S8 is implemented for plastically working a molded compact which has been obtained by subjecting the globular powdery thermoelectric material to the sintering under pressure or the cold compressing. The plastic working will be explained in detail later.

Incidentally, the step S8 may be further followed by a heat treatment (step S9). A heat treatment temperature on this occasion lies within a range of 250° C.–500° C., desirably 300 ° C.–400° C.

Thereafter, the thermoelectric material having undergone the step S8 or step S9 is sliced at a step S10 and is diced at a step S11. Thus, the thermoelectric element of desired size is finished up.

Next, the step of preparing the globular powdery thermoelectric material (the step S4) will be explained in detail.

Figure 2:
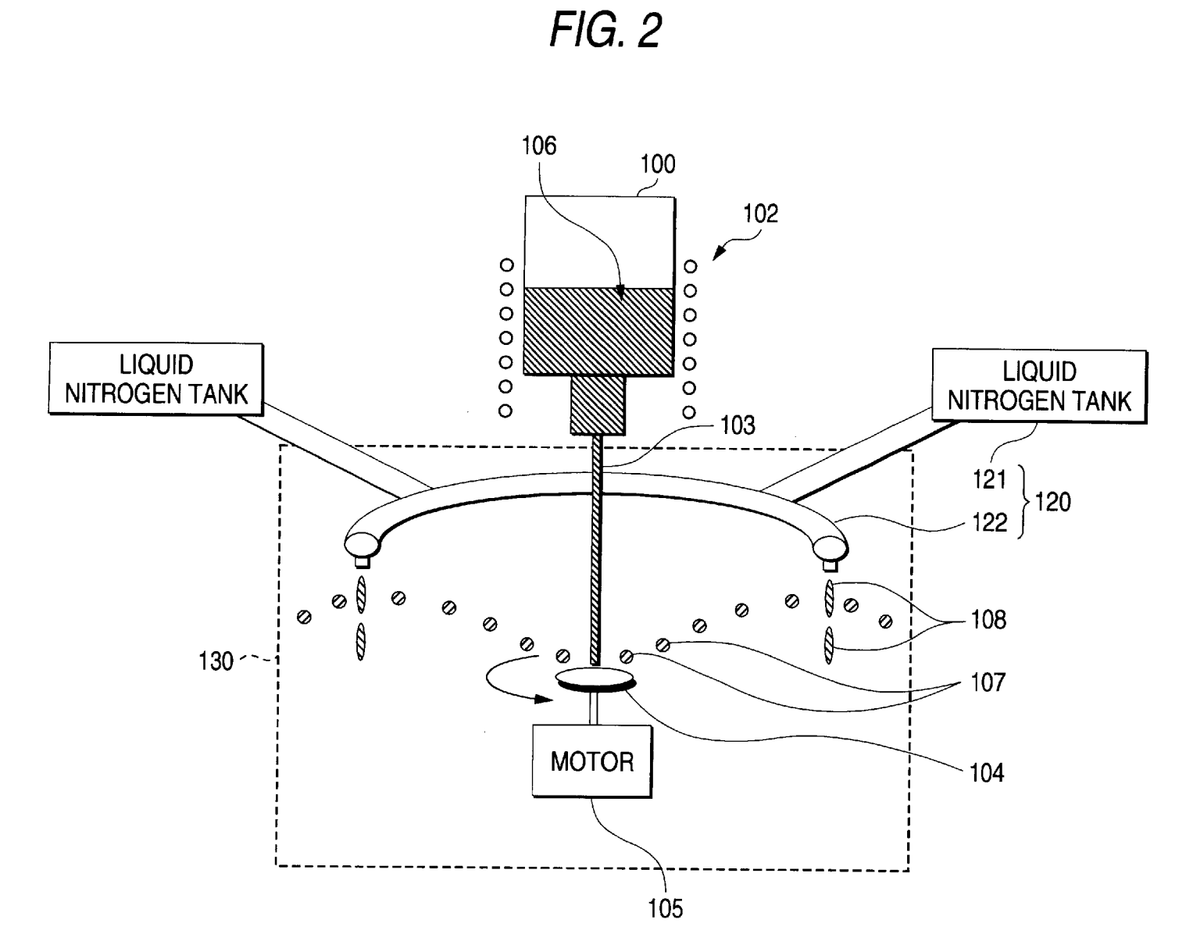
FIG. 2 is a diagram showing the principle of an apparatus for preparing a globular powdery thermoelectric material, which is used in the method of fabricating a thermoelectric element according to one embodiment of the present invention.

FIG. 2 is a diagram showing the principle of an apparatus for preparing the globular powdery thermoelectric material. Referring to the figure, the globular powdery thermoelectric material-preparing apparatus is broadly constructed of a chamber 100 in which the raw material is heat-melted so as to be dropped, and a chamber 130 in which liquid drops having fallen are turned into microglobules and are solidified.

First, the raw material having the predetermined composition, or the solid solution ingot obtained by solidifying the raw material once melted is put in the chamber 100 and is melted. The chamber 100 is heated to a high temperature by a high-frequency coil or heater 102 wound round this chamber. Besides, the chamber 100 is filled up with, for example, an inert gas, which is heated, whereby the melted material 106 is dropped onto a disc 104 via a funnel 103. Here, the funnel 103 has an opening whose diameter is, for example, about 0.4 mm, and it is arranged right over the disc 104.

The disc 104 is one of, for example, high-purity carbon disc (28 mm in diameter), and it is rotated at, for example, 16,000 r.p.m. by a motor mechanism 105. The liquid drops 107 of the material are dropped onto the disc 104 and are scattered. On this occasion, each of the liquid drops 107 is brought into a nearly perfectly globular shape by a surface tension.

Besides, the liquid drops 107 of the material may be sprayed into the microglobules alternatively to the operation of dropping the liquid drops 107 onto the disc 104 so as to scatter them.

The chamber 130 is filled up with a gas which has a heat capacity larger than that of the air, for example, helium (He) gas. It is also allowed to employ the atmosphere of an inert gas, for example, argon (Ar) gas or nitrogen ($N_2$) gas. A cooling unit 120 includes liquid nitrogen tanks 121 and a ring 122. In FIG. 2, the ring 122 is shown in section. The lower part of the ring 122 is formed with a large number of apertures, through which liquid nitrogen 108 supplied from the liquid nitrogen tanks 121 is shed into the chamber 130 as a shower. The liquid drops 107 scattered by the disc 104 and turned into the microglobules are quenched in touch with the shower of the liquid nitrogen 108, and are accumulated as powder. The powder is the globular powdery thermoelectric material. Owing to the quenching, the globularity ($r_{max}/r_{min}$) of the globular powder can be set at about 1–1.2. Besides, the grain diameter of the globular powder can be set at about 200 µm or below.

Next, the method of plastically working the globular powdery thermoelectric material (the step S8) will be explained in detail. In this embodiment, the hot extrusion molding is implemented as the hot plastic working at the step S8.

Figure 3:
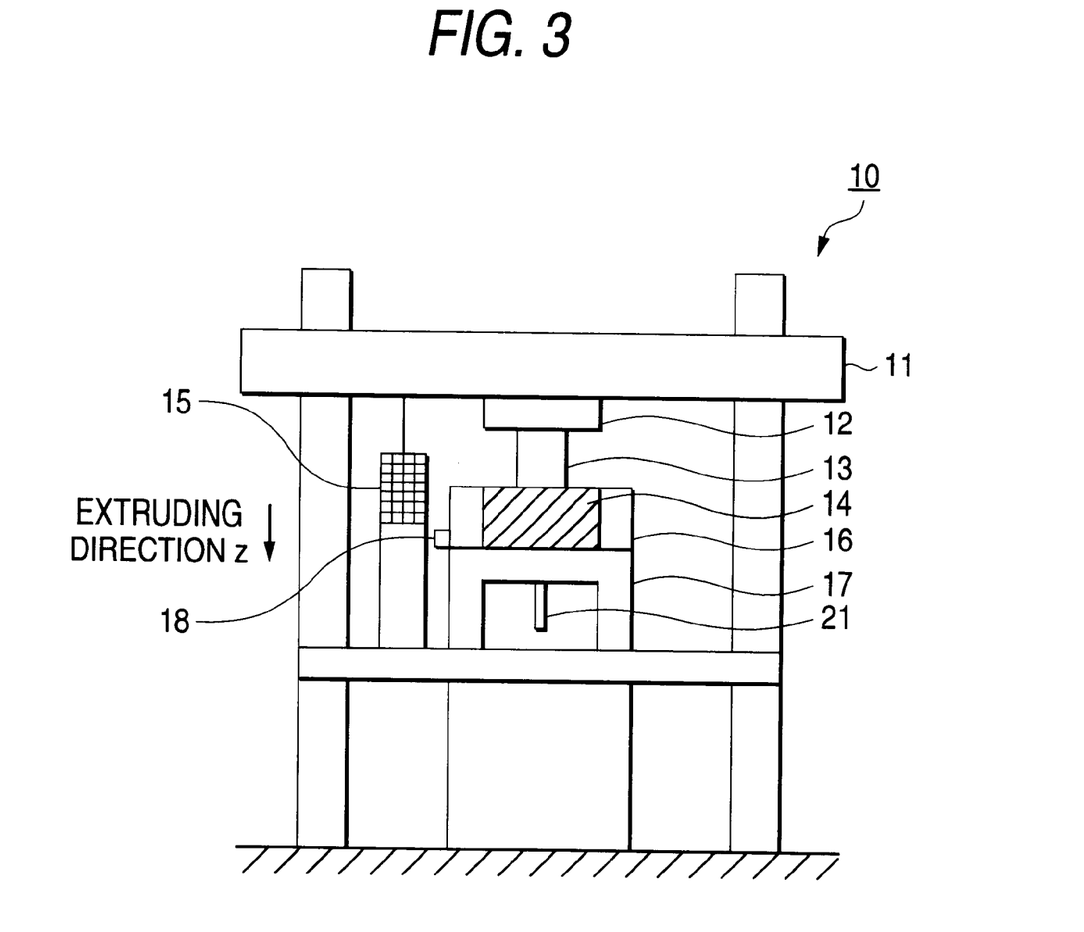
FIG. 3 is a side view showing an extrusion molding apparatus which is used in the method of fabricating a thermoelectric element according to the first embodiment of the present invention.

An extrusion molding apparatus for use in the hot extrusion molding is shown in FIG. 3. As shown in the figure, the extrusion molding apparatus 10 includes a punch 13 which is a metal mold for extruding the thermoelectric material 20 molded under pressure, and a die (extruding die) 14 which plastically deforms the thermoelectric material 20 extruded by the punch 13. A slide 11 is driven by, for example, hydraulic actuators (hydraulic cylinders) so as to move the punch 13 up and down. The extruding pressure of the punch 13 is measured by a load meter 12, while the extruding displacement of the punch 13 in an extruding direction z is measured by a displacement meter 15. The relationship between the measured value of the displacement meter 15 and an elapsed time is monitored, whereby the drive of the slide 11 can be controlled so that the punch 13 may extrude the thermoelectric material 20 at a constant extrusion rate.

The die 14 is mounted on a base 17, and is surrounded with a heater 16. Thus, the extrusion molding apparatus 10 can serve also as a heating apparatus. The temperature of the die 14 is measured by a temperature sensor 18 which is arranged in the vicinity of the die 14. The quantity of heat generation of the heater 16 is controlled by feeding back the measured value of the temperature sensor 18, whereby the die 14 as well as the thermoelectric material 20 can be held at a desired temperature.

The thermoelectric material 20 undergoes the plastic deformation in passing through the die 14 under the extrusion by the punch 13, whereby an extrusion-molded article 21 is obtained. The extrusion molding should desirably be carried out in the atmosphere of an inert gas such as argon (Ar) gas or a reducing gas such as hydrogen ($H_2$) gas, while a working temperature is held at 350° C.–600° C. By the way, although the punch 13 is moved with the die 14 fixed in this embodiment, the die 14 may be moved with the punch 13 fixed contrariwise.

Examples of die shapes will be mentioned below.
(1) Round Die

Figure 4:
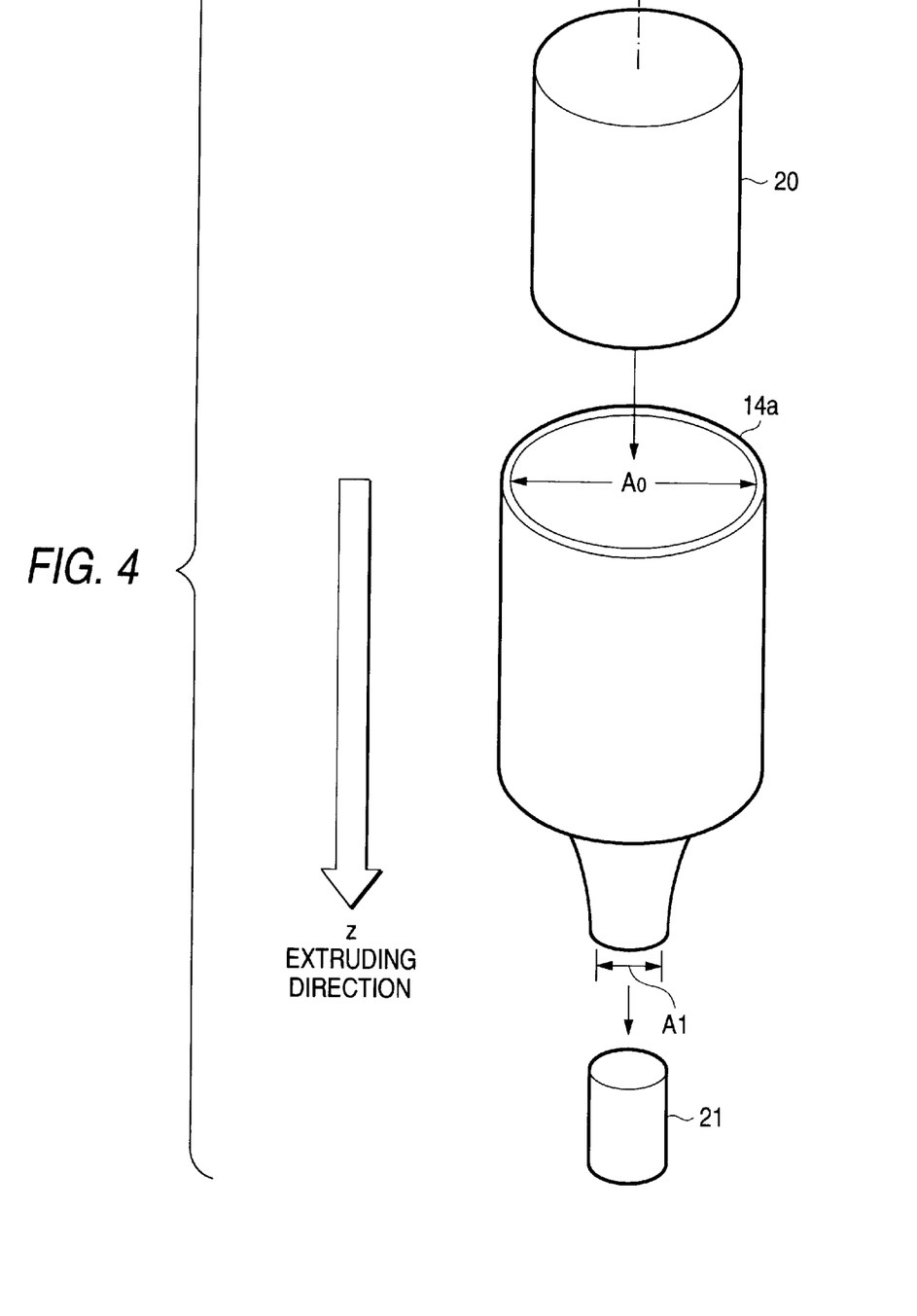
FIG. 4 is a perspective view showing the outline of a round die which is used in the first embodiment of the present invention.

FIG. 4 is a perspective view showing the outline of a die which is used in case of obtaining an extrusion-molded article in the shape of a round bar. In the figure, the inside diameter of the inlet of the round die 14a is indicated by symbol $A_0$, and that of the outlet by symbol $A_1$.

Figure 5:
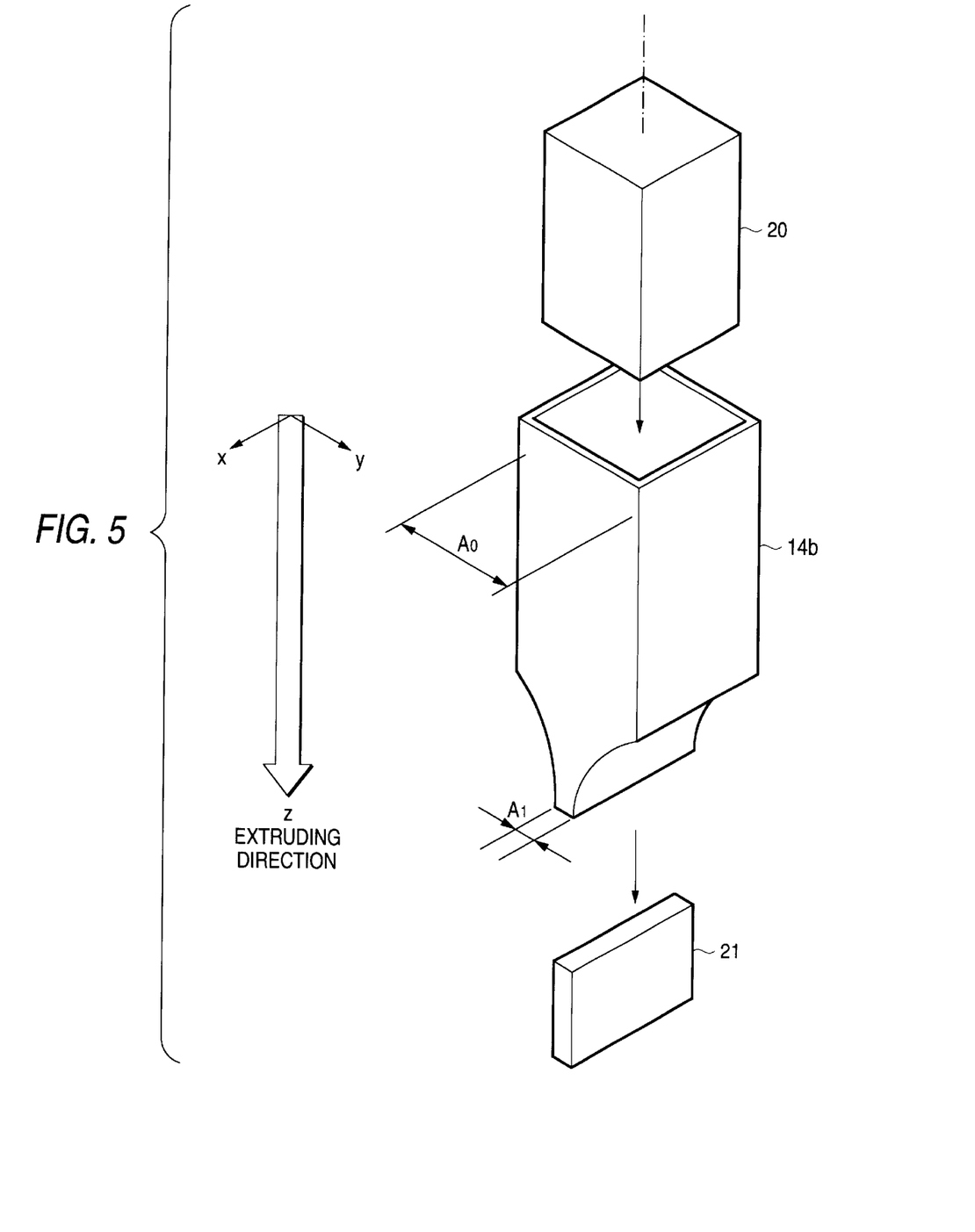
FIG. 5 is a perspective view showing the outline of a plane-strain extrusion die which is used in the first embodiment of the present invention.

With the die 14a, the thermoelectric material 20 receive forces uniformly from the whole inner peripheral surface of this die in directions perpendicular to the extruding direction (z-axial direction), so that the C-faces of hexagonal crystal grains are oriented in parallel with the z-axial direction.
(2) Plane-strain Extrusion Die FIG. 5 is a perspective view showing the outline of a plane-strain extrusion die which is used in case of obtaining a molded article in the shape of a rectangular parallelepiped. Referring to the figure, the plane-strain extrusion die 14b has a predetermined width in an x-axial direction orthogonal to the extruding direction (z-axial direction) and has its thickness decreased in a y-axial direction orthogonal to the z-axial direction and x-axial direction. In the figure, the thickness (inside diameter) of the inlet side of the plane-strain extrusion die 14b is indicated by symbol $A_0$, and that of the outlet side by symbol $A_1$. Accordingly, the extrusion ratio of the die 14b is expressed as $A_0/A_1$. In this example, the extrusion ratio is set at 6, and the radius of curvature of the inlet side toward the curved part of the die 14b is set at 20 mm, while the radius of curvature of the outlet side is set at 100 mm.

With the die 14b, the thermoelectric material 20 receives forces in the y-axial direction, so that the C-faces of crystal grains are oriented in parallel with a plane perpendicular to the y-axial direction. Accordingly, the orientation of crystals is heightened more than in the case of using the round die (1). Moreover, with this die 14b, the molded article 21 is shaped into the rectangular parallelepiped, so that it is less liable to be wasted in being worked into the thermoelectric elements at and after the step S10 indicated in FIG. 1. It is accordingly possible to enhance the available percentage of the products.

Figure 6:
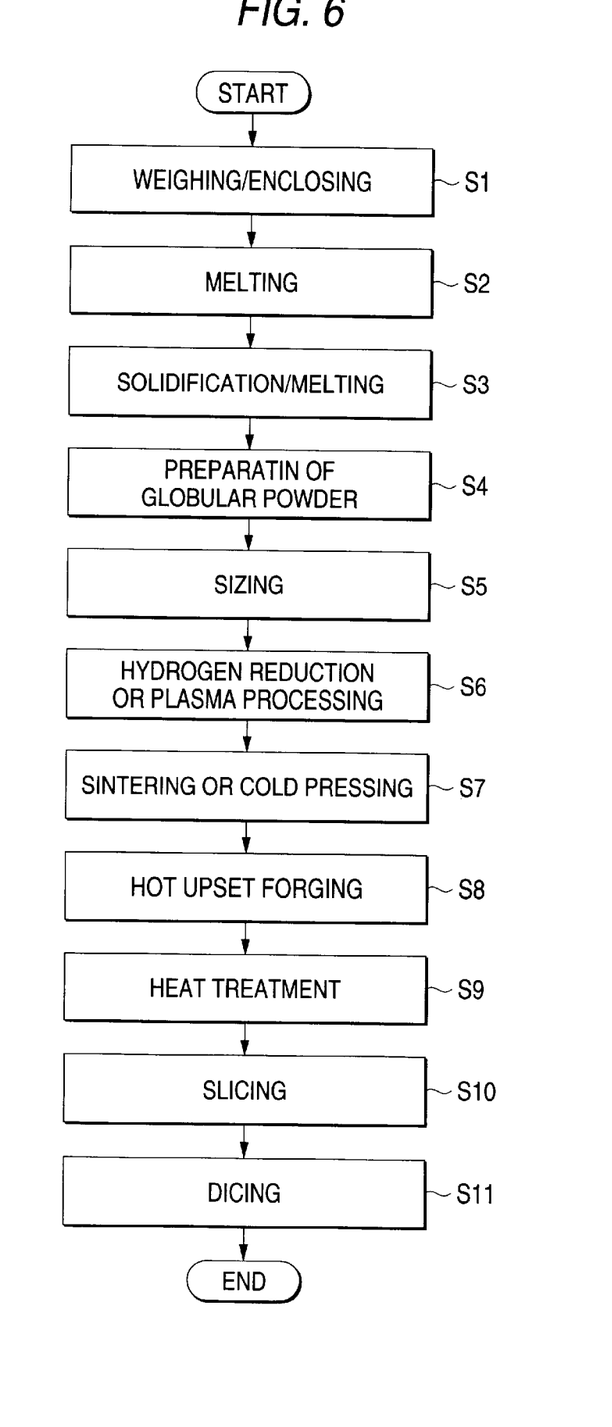
FIG. 6 is a flow chart showing a method of fabricating a thermoelectric element according to the second embodiment of the present invention.

Next, the second embodiment of the present invention will be described with reference to FIG. 6. The figure is a flow chart showing a method of fabricating a thermoelectric element according to this embodiment. In this embodiment, hot upset forging is implemented as the hot plastic working at the step S8. By way of example, the molded compact sintered under pressure at the step S7 is inserted into a metal mold whose side and bottom parts are fixed, and it is compression-molded by a heading punch from above. The method itself has hitherto been carried out. Since, however, the microglobular powdery thermoelectric material is employed as the material to-be-compressed, the orientation of crystal grains can be more heightened to enlarge the figure of merit.

Figure 7:
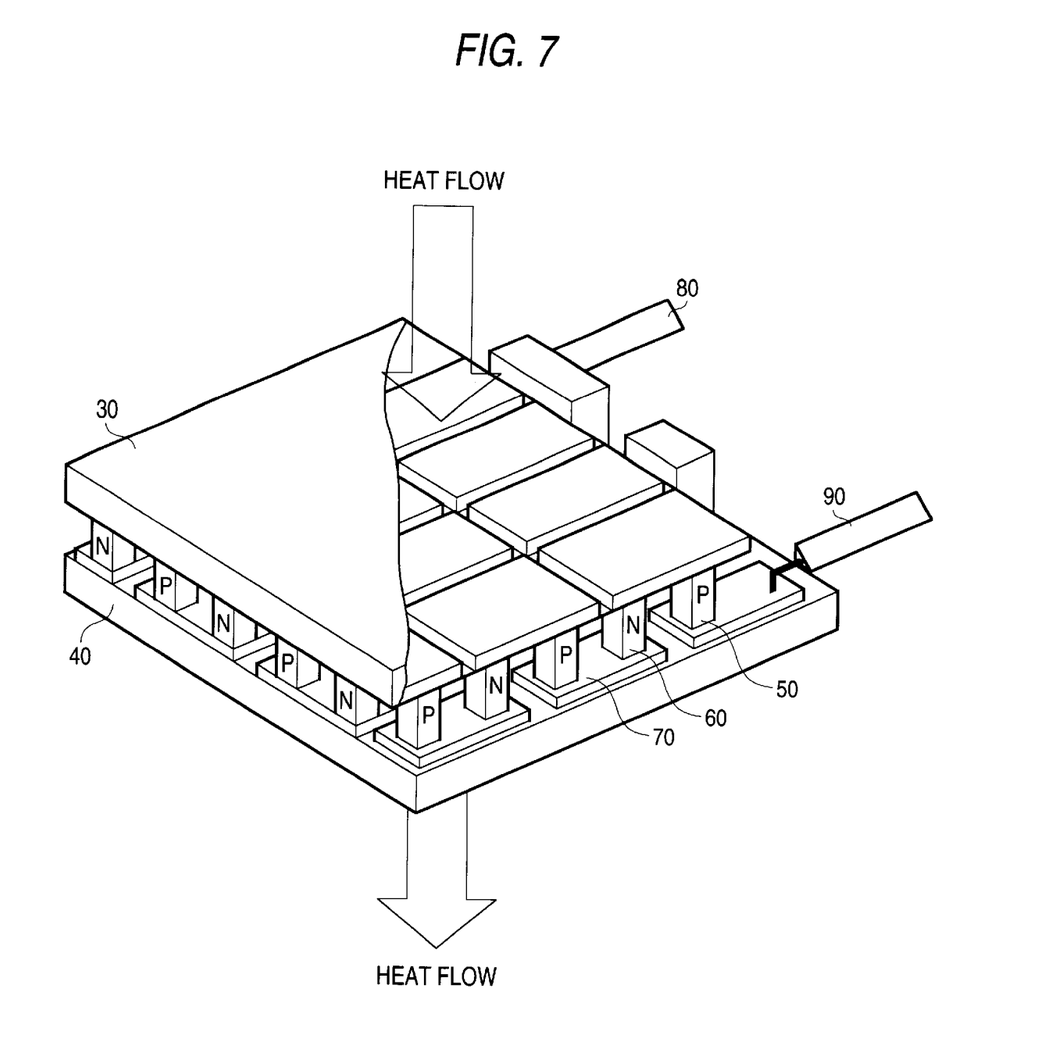
FIG. 7 is a perspective view, partially broken away, showing the structure of a thermoelectric module which includes thermoelectric elements according to the present invention.

Next, a thermoelectric module according to the present invention will be described with reference to FIG. 7.

The figure is a perspective view, partially broken away, showing the structure of the thermoelectric module which includes thermoelectric elements according to the present invention. Referring to the figure, P-type elements 50 and N-type elements 60 are connected through electrodes 70, thereby to form P-N element pairs. Further, the P-type elements and the N-type elements are alternately connected so as to form a series circuit, and they are arranged through the electrodes between two substrates 30, 40 made of ceramics or the likes. A current injection terminal (positive electrode) 80 is connected to the N-type element at one end of the series circuit based on the P-N element pairs, while a current injection terminal (negative electrode) 90 is connected to the P-type element at the other end. When current is caused to flow from the current injection terminal (positive electrode) 80 toward the current injection terminal (negative electrode) 90 via the series circuit of the P-N element pairs by applying a voltage across the current injection terminals 80, 90, the side of the ceramics substrate 30 is cooled, and the side of the ceramics substrate 40 is heated. As a result, a heat flow arises as indicated by arrows in the figure.

As thus far described, according to the present invention, a heat-melted material is turned into microglobules by scattering or spraying, and the microglobules are quenched, thereby to prepare a globular powdery thermoelectric material, so that the globular powdery thermoelectric material of high globularity, small grain diameters and small crystal grains can be obtained. Further, hot plastic working is carried out, so that homogeneity in plastic deformation can be attained to heighten a crystal orientation. It is accordingly possible to improve the figure of merit of a thermoelectric element or a thermoelectric module, and to enhance the available percentage of products.

What we claim is:

1. A method of fabricating a thermoelectric element, which comprises steps of:

(1) mixing and heat-melting a raw material of predetermined composition;

(2) forming and quenching the heat-melted material into a globular powder of thermoelectric material, and (3) plastically deforming a thermoelectric material derived from the globular powder of thermoelectric material in a hot condition by extruding the derived thermoelectric material in a first direction while compressing extruding thermoelectric material in directions perpendicular to the first direction, so as to bring crystal grains of the extruding thermoelectric material into a crystal orientation affording an excellent figure of merit.

2. The method of fabricating a thermoelectric element as defined in claim 1, including between steps (2) and (3) additional steps of:

(2.1) sorting the globular powder of thermoelectric material into uniform grain diameters; and (2.2) sintering under pressure the globular powder of thermoelectric material having uniform grain diameters.

3. The method of fabricating a thermoelectric element as defined in claim 2, wherein step (2) includes scattering and spraying the heat-melted material by dropping the heat-melted material onto a rotating disc.

4. The method of fabricating a thermoelectric element as defined in claim 2, wherein step (2) includes removing oxide films from the globular powder of thermoelectric material by either of hydrogen reduction and plasma processing.

5. The method of fabricating a thermoelectric element as defined in claim 2, wherein during step (2) the heat-melted material is formed into the globular powder of thermoelectric material that has a grain diameter of at most 200 $\mu$m.

6. The method of fabricating a thermoelectric element as defined in claim 2, wherein the raw material is a semiconductor selected from the group consisting of P-type and N-type and the raw material contains at least two elements selected from the group consisting of Bi, Te, Sb and Se.

7. The method of fabricating a thermoelectric element as defined in claim 2, wherein step (3) is carried out by extruding the derived thermoelectric material along a z-axis while compressing extruding thermoelectric material along x- and y-axes, so that crystal grains of the extruding thermoelectric material are brought into a crystal orientation along the z-axis affording an excellent figure of merit.

8. The method of fabricating a thermoelectric element as defined in claim 2, wherein step (3) is carried out by extruding the derived thermoelectric material along a z-axis through a circular dye having a decreasing diameter along the z-axis where an axis of the circular dye corresponds to the z-axis of extruding thermoelectric material and the decreasing diameter of the circular dye comprises compressing the extruding of thermoelectric material, so that crystal grains of the extruding thermoelectric material are brought into a crystal orientation along the z-axis affording an excellent figure of merit.

9. The method of fabricating a thermoelectric element as defined in claim 1, including between steps (2) and (3) additional steps of:

(2.1) sorting the globular powder of thermoelectric material into uniform grain diameters; and (2.2) cold pressing the globular powder of thermoelectric material having uniform grain diameters.

10. The method of fabricating a thermoelectric element as defined in claim 9, wherein step (2) includes scattering and spraying the heat-melted material by dropping the heat-melted material onto a rotating disc.

11. The method of fabricating a thermoelectric element as defined in claim 9, wherein step (2) includes removing oxide films from the globular powder of thermoelectric material by either hydrogen reduction and plasma processing.

12. The method of fabricating a thermoelectric element as defined in claim 9, wherein during step (2) the heat-melted material is formed into the globular powder of thermoelectric material that has a grain diameter of at most 200 $\mu$m.

13. The method of fabricating a thermoelectric element as defined in claim 9, wherein step (3) is carried out by extruding the derived thermoelectric material along a z-axis while compressing extruding thermoelectric material along x- and y-axes, so that crystal grains of the extruding thermoelectric material are brought into a crystal orientation along the z-axis affording an excellent figure of merit.

14. The method of fabricating a thermoelectric element as defined in claim 9, wherein step (3) is carried out by extruding the derived thermoelectric material along a z-axis through a circular dye having a decreasing diameter along the z-axis where an axis of the circular dye corresponds to the z-axis of extruding thermoelectric material and the decreasing diameter of the circular dye comprises compressing the extruding thermoelectric material, so that crystal grains of the extruding thermoelectric material are brought into a crystal orientation along the z-axis affording an excellent figure of merit.

15. The method of fabricating a thermoelectric element as defined in claim 1, wherein step (2) includes scattering and spraying the heat-melted material by dropping the heat-melted material onto a rotating disc.

16. The method of fabricating a thermoelectric element as defined in claim 15, wherein the raw material is a semiconductor selected from the group consisting of P-type and N-type and the raw material contains at least two elements selected from the group consisting of Bi, Te, Sb and Se.

17. The method of fabricating a thermoelectric element as defined in claim 1, wherein step (2) includes removing oxide films from the globular powder of thermoelectric material by either of hydrogen reduction and plasma processing.

18. The method of fabricating a thermoelectric element as defined in claim 1, wherein during step (2) the heat-melted material is formed into the globular powder of thermoelectric material that has a grain diameter of at most 200 $\mu$m.

19. The method of fabricating a thermoelectric element as defined in claim 1, wherein the raw material is a semiconductor selected from the group consisting of P-type and N-type and the raw material contains at least two elements selected from the group consisting of Bi, Te, Sb and Se.

20. The method of fabricating a thermoelectric element as defined in claim 1, wherein step (3) is carried out by extruding the derived thermoelectric material along a z-axis while compressing extruding thermoelectric material along x- or y-axes, so that crystal grains of the extruding thermoelectric material are brought into a crystal orientation along the z-axis affording an excellent figure or merit.

21. The method of fabricating a thermoelectric element as defined in claim 1, wherein step (3) is carried out by extruding the derived thermoelectric material along a z-axis through a circular dye having a decreasing diameter along the z-axis where an axis of the circular dye corresponds to the z-axis of extruding thermoelectric material and the decreasing diameter of the circular dye comprises compressing the extruding thermoelectric material, so that crystal grains of the extruding thermoelectric matrial are brought into a crystal orientation along the z-axis affording an excellent figure of merit.

22. A method of fabricating a thermoelectric element, which comprises steps of:

mixing and heat-melting a raw material of predetermined composition;

forming the heat-melted material into a globular powder of thermoelectric material by dropping the heat melted thermoelectric material onto a rotating disc, and quenching the globular powder of thermoelectric material, filtering the globular powder of thermoelectric material into uniform grain diameters of at most 200 $\mu$m;

sintering under pressure the globular powder of thermoelectric material having uniform grain diameters, and plastically deforming resulting sintered thermoelectric material by hot extrusion molding the sintered thermoelectric material in a first direction while compressing the sintered thermoelectric material in directions perpendicular to the first direction in an atmosphere selected from the group consisting of an inert gas and hydrogen, so as to bring crystal grains of the sintered thermoelectric material into a crystal orientation affording an excellent figure of merit.

23. A method of fabricating a thermoelectric element, which comprises steps of:

mixing and heat-melting a raw material of predetermined composition;

forming the heat-melted material into a globular powder of thermoelectric material by dropping the heat melted thermoelectric material onto a rotating disc, and quenching the globular powder of thermoelectric material, filtering the globular powder of thermoelectric material into uniform grain diameters of at most 200 $\mu$m;

sintering under pressure the globular powder of thermoelectric material having uniform grain diameters, and plastically deforming resulting sintered thermoelectric material by hot forging in a hot condition by inhibiting expansion of the sintered thermoelectric material in first and second directions, the first and second directions being perpendicular to each other, while compressing the sintered thermoelectric material in a third direction that is perpendicular to the first and second directions, so as to bring crystal grains of the sintered thermoelectric material into a crystal orientation affording an excellent figure of merit.

* * * * *